US006925427B1

(12) United States Patent
Montgomery

(10) Patent No.: US 6,925,427 B1
(45) Date of Patent: Aug. 2, 2005

(54) METHOD OF DETERMINING A SWITCH SEQUENCE PLAN FOR AN ELECTRICAL SYSTEM

(75) Inventor: Thomas Anthony Montgomery, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 09/543,028

(22) Filed: Apr. 4, 2000

(51) Int. Cl.$^7$ ............................................. G06F 17/50
(52) U.S. Cl. ............................ 703/13; 703/14; 700/11; 701/36
(58) Field of Search ...................... 703/13, 14; 307/35; 700/11; 701/36

(56) References Cited

U.S. PATENT DOCUMENTS

| | | | | |
|---|---|---|---|---|
| 4,292,543 A | * | 9/1981 | Reed, Sr. ...................... | 307/35 |
| 4,839,853 A | | 6/1989 | Deerwester et al. | |
| 5,500,802 A | | 3/1996 | Morris et al. | |
| 5,778,367 A | | 7/1998 | Wesinger, Jr. et al. | |
| 5,845,221 A | * | 12/1998 | Hosokawa et al. ........... | 701/36 |
| 5,877,966 A | | 3/1999 | Morris et al. | |
| 6,480,815 B1 | * | 11/2002 | Olson et al. .................. | 703/14 |

OTHER PUBLICATIONS

Microsoft Project 98 Bible, by Nancy Stevenson and Elaine Marmel, by IDG Books, 1997, ISBN 0-7645-3155-7, pp. 22, 53, 55, 57, 93, 95, 124, 151, 187 224, 225.*

* cited by examiner

Primary Examiner—Kevin J. Teska
Assistant Examiner—Ed Garcia-Otero
(74) Attorney, Agent, or Firm—Bliss McGlnn PC; Damian Porcari

(57) ABSTRACT

A method of determining a switch sequence plan for an electrical system includes the steps of identifying switches for the electrical system and organizing the identified switches within a switch group by defining a coincident group of switches to be closed together or a sequential group of switches to be closed one at a time and by defining a duration of time the switches should be closed. The method also includes the steps of organizing the switch group in a data tree structure for the switch sequence plan and traversing the data tree structure recursively to calculate opening and closing times for the switches within the switch sequence plan. The method further includes the steps of generating a simulation command for setting a position sequence of the switches from the opening and closing times for the switch sequence plan and using commands within the switch sequence plan to operatively control the switches in a simulation of the electrical system.

13 Claims, 3 Drawing Sheets

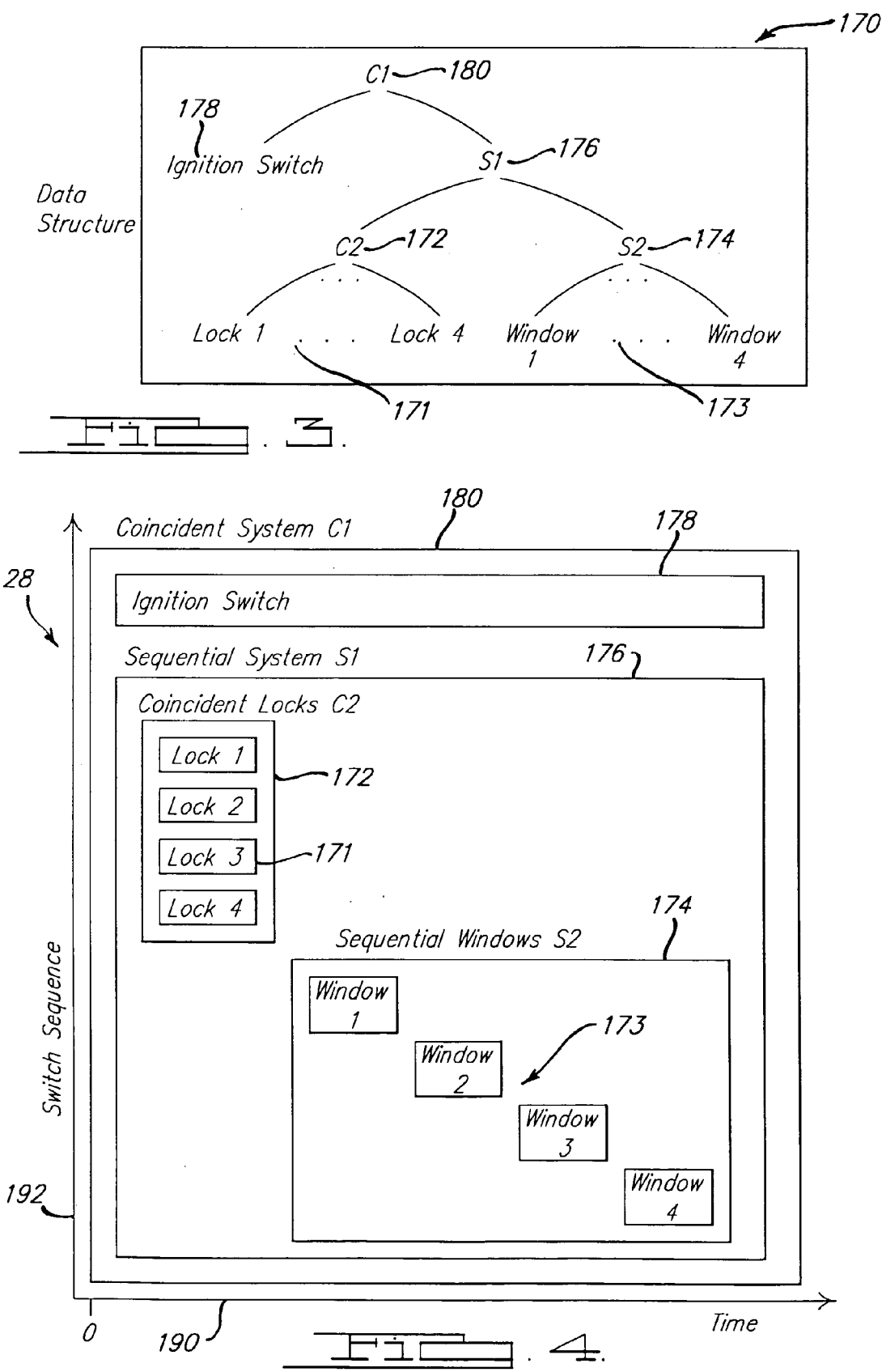

METHOD OF DETERMINING A SWITCH SEQUENCE PLAN FOR AN ELECTRICAL SYSTEM

BACKGROUND OF THE INVENTION

1. Field of the Invention

The present invention relates generally to electrical systems and, more specifically, to a method of determining a switch sequence plan for an electrical system in a vehicle.

2. Description of the Related Art

Electrical and electronic features are contained within many types of systems. A system in a vehicle, and in particular an automotive vehicle, includes electrical/electronic features that relate to the operation of the vehicle, as well as enhance the comfort of an occupant within the vehicle. Examples of electrical/electronic features include a climate control system, an interior and exterior lighting system, a power door lock system, a power window system, and an audio component system. Many of these features are independent, while others are functionally interrelated.

It is known within electrical/electronic system design to utilize a computer aided design process in designing a complex electrical/electronic system, such as for a vehicle. One aspect of electrical/electronic system computer-aided design is to simulate the operation of an electrical circuit by simulating electrical loads within the electrical system. For example, a load survey analysis reviews the electrical circuit and determines if a wire gauge is acceptable or if a fuse has sufficient capacity.

Another aspect of electrical/electronic system computer-aided design is to simulate an operational sequence for various switches within the electrical/electronic system. In the past, the switching sequence was determined using trial and error techniques to determine the exact time each switch should open or close. However, these techniques are time-consuming and cumbersome if the electrical/electronic system contains a large number of switches. Thus, there is a need in the art for a method of determining a switch sequence plan for an electrical system using a computer aided design technique.

SUMMARY OF THE INVENTION

Accordingly, the present invention is a method of determining a switch sequence plan for an electrical system. The method includes the steps of identifying switches for the electrical system and organizing the identified switches within a switch group by defining a coincident group of switches to be closed together or a sequential group of switches to be closed one at a time and by defining a duration of time the switches should be closed. The method also includes the steps of organizing the switch group in a data tree structure for the switch sequence plan and traversing the data tree structure recursively to calculate opening and closing times for the switches within the switch sequence plan. The method further includes the steps of generating a simulation command for setting a position sequence of the switches from the opening and closing times for the switch sequence plan and using the commands within the switch sequence plan to operatively control the switches in a simulation of the electrical system.

One advantage of the present invention is that a method of determining a switch sequence plan for an electrical system is provided that creates a switch sequence plan that can be easily updated and modified. Another advantage of the present invention is that the method provides an optimized switch sequence plan that can be used as an input to a electrical/electronic system computer aided design software program. Still another advantage of the present invention is that the method hierarchically organizes the switches in nested groups and determines the exact time in the simulation that the switches open or close, so that switches can be added or removed without manually cascading time changes through all of the switches. A further advantage of the present invention is that the method organizes the switches and switch groups into a data tree structure as part of the switch sequence plan.

Other features and advantages of the present invention will be readily appreciated, as the same becomes better understood, after reading the subsequent description taken in conjunction with the accompanying drawings.

BRIEF DESCRIPTION OF THE DRAWINGS

FIG. 3 is an example of a data tree structure for a switch sequence plan, according to the present invention, for the method of FIG. 2.

FIG. 4 is a graph of a switch sequence plan, according to the present invention, for the method of FIG. 2.

DESCRIPTION OF THE PREFERRED EMBODIMENT(S)

A design of an electrical/electronic system and in particular an electrical/electronic system on a vehicle, is achieved with a computer-aided design process. Advantageously, this process allows flexibility in electrical/electronic system design and engineering analysis of the design in a fraction of the time required using conventional design methods. Various computer-based tools are integrated to achieve this enormous time and expense savings, including electrical circuit modeling, parametric design, automated studies and a knowledge-based engineering library.

Figure 1:
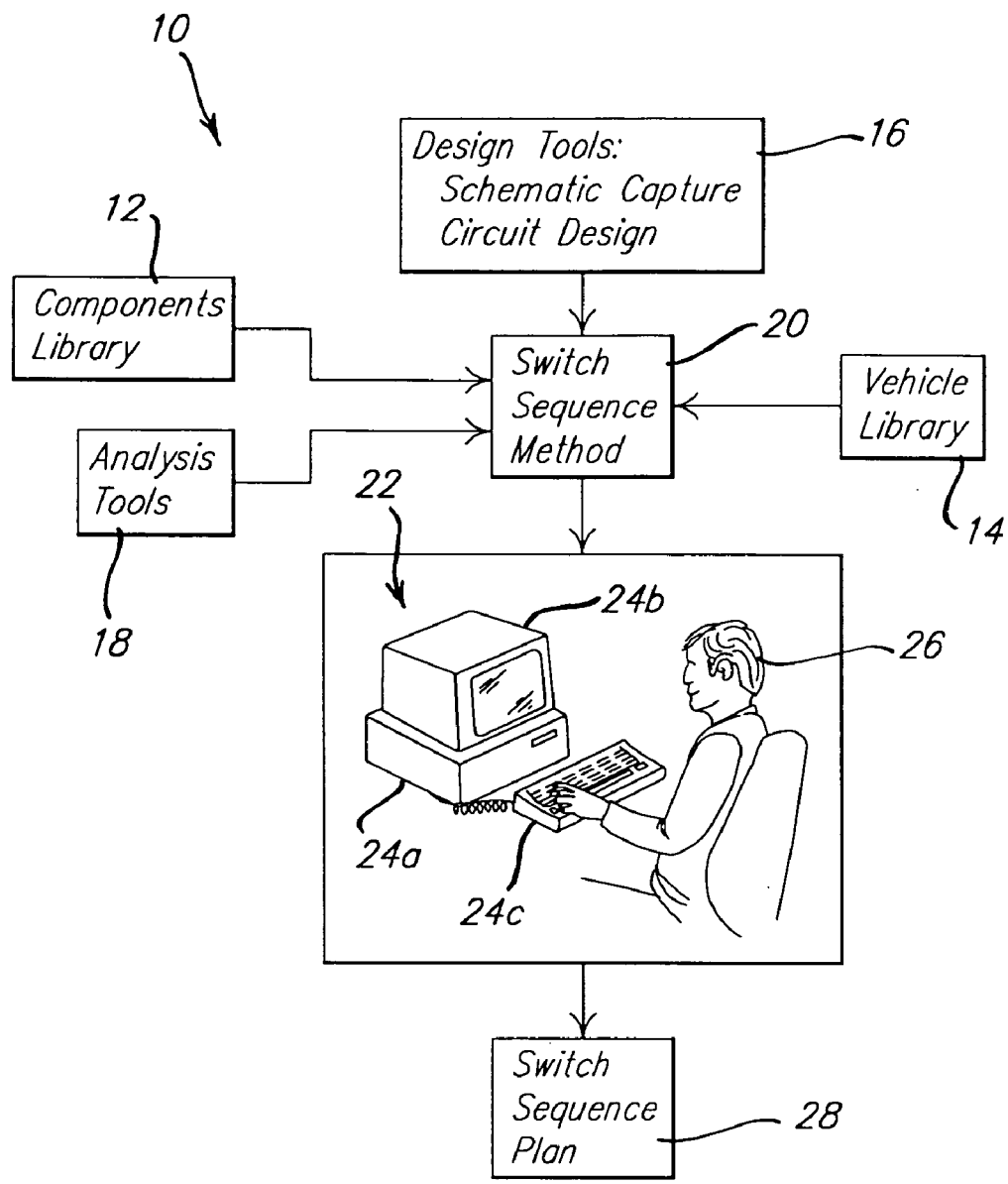
FIG. 1 is a block diagram of a system which may be utilized with a method of determining a switch sequence plan for an electrical system, according to the present invention.

Referring to the drawings and in particular FIG. 1, the tools 10 used by a method of determining a switch sequence plan for an electrical system, according to the present invention, are illustrated graphically. It should be appreciated that in this example the electrical system is part of a vehicle (not shown), and in particular an automotive vehicle.

The tools 10 include a knowledge-based engineering library 12 stored on an electronic storage device (not shown) that is operatively connected to a computer system 22 to be described. The knowledge-based engineering library 12 is a database of sub-libraries containing an electronic representation of data including various experts' knowledge of information relevant to the design of the electrical system for the vehicle. The knowledge-based engineering library 12 may include information such as design, assembly and manufacturing rules and guidelines. The knowledge-based engineering library 12 may also contain data in electronic form regarding various types of vehicle electrical/electronic system features. The knowledge-based engineering library 12 may further contain predetermined product assumptions regarding the vehicle to be designed, such as model year, style, or production volume.

The knowledge-based engineering library 12 may include a sub-library, such as a circuit diagram library of particular schematic diagrams for features used on a vehicle. The circuit diagram sub-library may contain information such as a circuit diagram of a particular feature, as well as parameters defining attributes of the circuit. A user 26 may select an attribute that is relevant to the design of the electrical system. For example, a relevant attribute may include a maximum current criterion.

The tools 10 also include a vehicle library 14 stored on the electronic storage device. The vehicle library 14 is an electrical representation of a vehicle model or a portion thereof. Advantageously, the vehicle library 14 may contain parameters defining various vehicles and vehicle system characteristics, such as interior size and vehicle body style. It should be appreciated that the vehicle library 14 may be a sub-library of the knowledge-based engineering library 12.

The tools 10 may also include various computer-aided design (CAD) tools 16, which can be used by the method, to be described. These design tools 16 may include schematic capture modeling, visualization and circuit design techniques. Circuit design, for example, takes electronically stored vehicle model data from the vehicle library 14 and standard electrical/electronic system feature data from the knowledge-based engineering library 12 and builds complex circuits for part-to-part or full assembly analysis. Several modeling programs are commercially available and generally known to those skilled in the art.

The tools 10 also include various computer-aided engineering (CAE) analysis tools 18. An example of a CAE analysis tool 18 is an electrical/electronic system circuit simulation technique that models an electrical system. A load survey and voltage drop analysis can be determined using the electrical/electronic system circuit simulation. Several software programs are commercially available to perform these analyses and are generally known to those skilled in the art. An example of an electrical/electronic circuit simulation software program is Saber, by Analogy.

The tools 10 further include the computer system 22, as is known in the art, to implement a method according to the present invention to be described, of determining a switch sequence plan for an electrical system. The computer system 22 includes a processor and a memory 24a, which can provide a display of information for the design of a system, such as the electrical system, on a display device such as a video terminal 24b.

In this example, the information is displayed on the video terminal 24b in a series of screens. Selection and control of the information within a screen can be achieved by the user 26, via a user interactive device 24c, such as a keyboard or a mouse. The user 26 inputs a set of parameters or a set of instructions into the computer system 22 when prompted to do so. The set of parameters or the set of instructions may be product specific, wherein other data and instructions non-specific to the product may already be stored in the memory 24a.

One example of an input method is a pop-up screen containing available information or instructions, including an on-line description for the parameter and a current value therefore. For example, information may be chosen from a table within a two-dimensional mode.

The computer system 22 utilizes the set of information or instructions from the user 26, and any other information regarding related vehicle systems and information from the libraries 12, 14, design tools 16 and analysis tools 18, for a method 20, according to the present invention and discussed in detail subsequently, of determining a switch sequence plan for an electrical system.

Advantageously, the computer implemented method of determining a switch sequence plan 28 for an electrical system, to be described, combines all of the foregoing to provide an efficient, flexible, rapid tool for making an informed decision regarding the design of an electrical/electronic system. Further, a switch sequence plan 28 is an output of the method 20 and the switch sequence plan 28 is available for further analysis and study.

Figure 2:
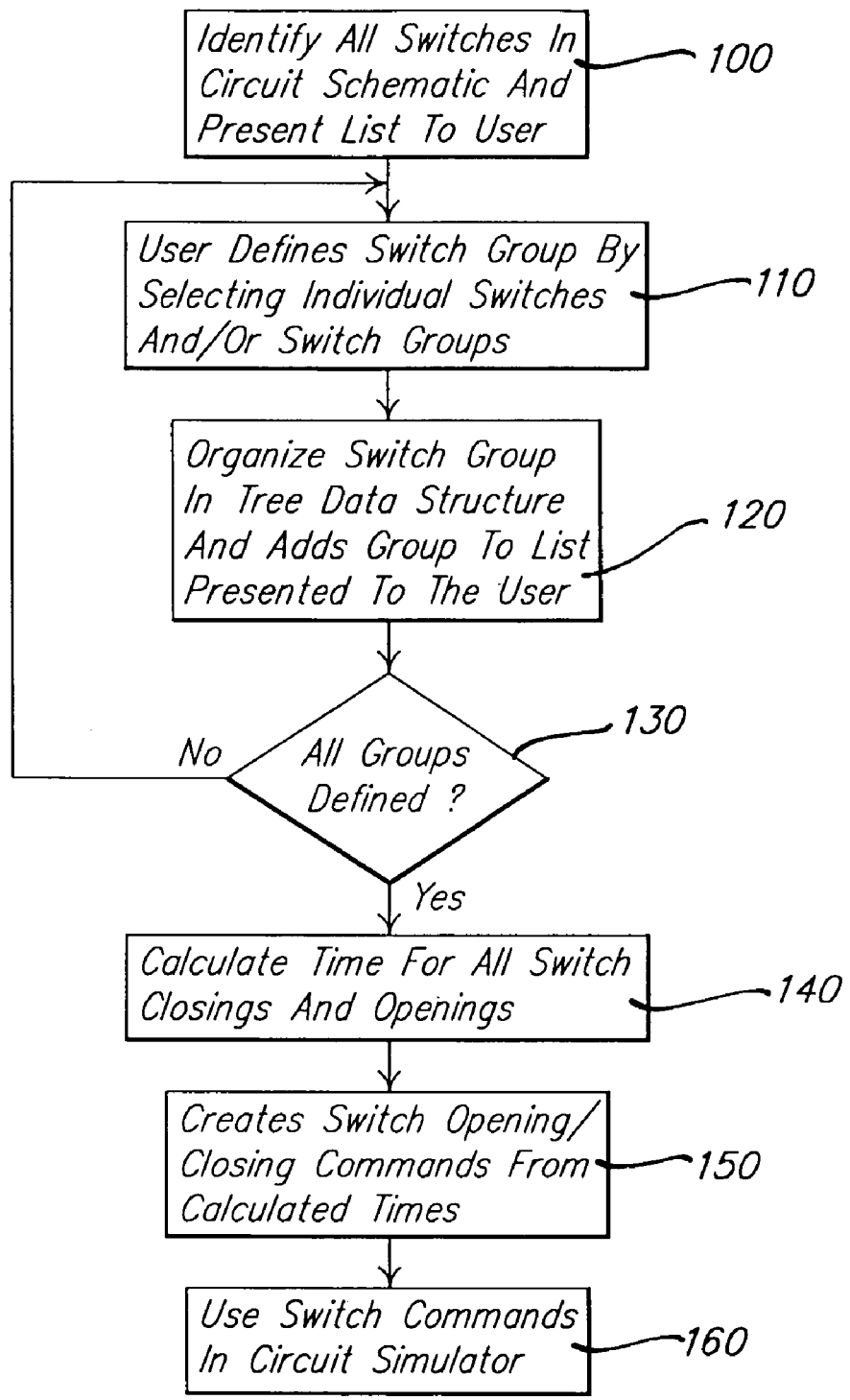
FIG. 2 is a flowchart of a method of determining a switch sequence plan for an electrical system, according to the present invention.

Referring to FIG. 2, a method 20 of determining a switch sequence plan 28 for an electrical system is illustrated, and in particular an electrical system for the vehicle of this example. The methodology begins in block 100, and all switches contained within a schematic diagram of an electrical circuit are identified. Preferably, a list of the switches organized by function is displayed on the video terminal 24b. It should be appreciated that the switches may be of a type such as single pole, single throw, or double throw, as is known in the art. Examples of switches known in the art within the electrical/electronic system on a vehicle include an ignition switch (not shown), a power door lock switch (not shown), or a power window switch (not shown). Preferably, the schematic diagrams are maintained in the knowledge based engineering library 12. The methodology advances to block 110.

In block 110, the user 26 defines a new switch group by first selecting individual switches and/or existing switch groups from the list of switches and/or existing switch groups for the electrical circuit. The user 26 specifies whether a switch or switch group within the new switch group should be coincident, that is closed at the same time, or sequential, that is closed one at a time. An example of a coincident switch group is the switches for the power door locks, that are intended to operate together. An example of a sequential switch group is the power door lock switch group and the power window switch group, which are not intended to operate together. The user 26 then organizes the switches and switch groups in a bottom up manner, from lowest level to highest level. It should be appreciated that groups of lower level switches and switch groups can be nested within higher level switch groups, until the top level switch group for the switch sequence plan is defined. Advantageously, existing switch groups can be used recursively in defining the top level switch group.

The user 26 also specifies how long the sequential or coincident switch groups within the switch sequence plan should be closed, and the time delay between closings as part of the switch sequence plan using the keyboard or mouse 24c. For example, the amount of time the switches are closed is referred to as the switch minimum duration. Advantageously, a switch can be identified by the user 26 as a supply switch that is closed first and kept closed for the duration of the switch group. The amount of time a supply switch closes before the rest of the group is referred to as a supply lead time. If the switch group is sequential, the switches will close one at a time and wait a sequential gap time between each switch closing. If the switch group is coincident, they will all close and open at the same time. The methodology advances to block 120.

In block 120, the methodology organizes the switch groups within the top level switch group in a tree data structure, as shown in FIG. 3, to be described. Advantageously, lower level switch groups are nested within higher level switch groups within the tree structure, to complete the entire tree structure. Preferably, the list of switch groups displayed on the video terminal 24a is updated to include the newly formed switch groups. The methodology advances to diamond 130.

In diamond 130, the methodology determines if all coincident and sequential switch groups have been defined within the top level switch group. For example, the methodology may ask the user 26 if the user 26 wants to define another switch or switch group. If the top level switch group is not defined, the methodology returns to block 110 and continues. Returning to diamond 130, if the top level switch group is defined, the methodology advances to block 140.

In block 140, the methodology recursively traverses through the switch groups in the data tree structure, and calculates an exact opening and closing time for each switch group as part of the switch sequence plan 28. The switch sequence plan 28 is illustrated in FIG. 4 to be described. Advantageously, modifications can be made to the coincident or sequential switch groups without manually cascading time changes through all switches in the electrical circuit. The methodology advances to block 150.

In block 150, the methodology generates an executable data file containing simulation commands for setting the position sequences of all switches within the switch sequence plan 28. The switch sequence plan 28 includes the coincident or sequential switch groups comprising the top level switch group, and switch opening and closing times for each switch contained therein. The methodology advances to block 160.

In block 160, the switch sequence plan 28, represented by the executable data file, is available for further analysis, such as by circuit analysis. Advantageously, the switch sequence 28 plan is formatted to provide an input to another computer-aided analysis tool 18, such as the electrical/electronic circuit simulation. For example, an electrical load survey and voltage drop analysis may be performed using the switch sequence plan 28 as an input.

Referring to FIG. 3, an example of a data tree structure 170 for a switch sequence plan is illustrated. In this example, power door lock switches (1 through 4) 171 are part of coincident switch group two (C2) 172. Similarly, power window switches (1 through 4) 173 are part of sequential switch group two (S2) 174. Switch groups (C2) 172 and (S2) 174 comprise sequential switch group one (S1) 176. Switch groups (S1) 176 and the ignition switch 178 form the top level group, coincident group one (C1) 180.

Referring to FIG. 4, a switch sequence plan 28 is illustrated graphically. The x-axis 190 represents time, and in particular the duration of time a switch or switch group is closed. The y-axis 192 represents the individual switches contained within the switch groups. Advantageously, the sequential, coincident and combined sequential and coincident switch closing pattern for the switch sequence plan 28 is illustrated.

The present invention has been described in an illustrative manner. It is to be understood that the terminology, which has been used, is intended to be in the nature of words of description rather than of limitation.

Many modifications and variations of the present invention are possible in light of the above teachings. Therefore, within the scope of the appended claims, the present invention may be practiced other than as specifically described.

What is claimed is:

1. A method of determining a switch sequence plan for an electrical system, said method comprising the steps of:
   identifying switches for the electrical system;
   organizing the identified switches within a switch group by defining a coincident group of switches to be closed together or a sequential group of switches to be closed one at a time and by defining a duration of time the switches should be closed;
   organizing the switch group in a data tree structure for the switch sequence plan;
   traversing the data tree structure recursively to calculate opening and closing times for the switches within the switch sequence plan;
   generating a simulation command for setting a position sequence of the switches from the opening and closing times for the switch sequence plan; and
   using the commands within the switch sequence plan to operatively control the switches in a simulation of the electrical system.

2. A method as set forth in claim 1 including the step of selecting an individual switch or a group of switches from a list displayed on a video terminal of a computer system.

3. A method as set forth in claim 1 wherein said step of organizing the switches within a switch group includes nesting sequential switch groups and coincident switch groups within a top level switch group.

4. A method as set forth in claim 1 including the step of determining a duration of time between switch closings for a sequential switch group.

5. A method as set forth in claim 1 wherein said step of organizing the switch group in a data tree structure includes nesting lower level sequential switch groups or coincident switch groups within higher level sequential switch groups or coincident switch groups.

6. A method as set forth in claim 1 including the step of using the switch sequence plan to analyze an electrical load distribution of the electrical system.

7. A method of determining a switch sequence plan for an electrical system, said method comprising the steps of:
   identifying switches from a circuit schematic of the electrical system;
   selecting an individual switch or a group of switches from a list displayed on a video terminal of a computer system;
   organizing the identified switches within a switch group by nesting within each other a coincident group of switches to be closed together or a sequential group of switches to be closed one at a time;
   defining a duration of time the switches in the sequential switch group or coincident switch group should be closed;
   organizing the switch group in a data tree structure for the switch sequence plan;
   traversing the data tree structure recursively to calculate opening and closing times for the switches in the sequential switch group or coincident switch group for the switch sequence plan;
   generating a simulation command for setting a position sequence of the switches within the sequential switch group or coincident switch group from the opening and closing times for the switch sequence plan; and
   using the commands within the switch sequence plan to operatively control the switches in a simulation of the electrical system.

8. A method as set forth in claim 7 including the step of determining a duration of time between switch closings for a sequential switch group.

9. A method as set forth in claim 7 wherein said step of organizing the switch group in a data tree structure includes nesting lower level sequential switch groups or coincident switch groups within higher level sequential switch groups or coincident switch groups.

10. A method as set forth in claim 7 including the step of using the switch sequence plan to analyze an electrical load distribution of the electrical system.

11. A method of determining a switch sequence plan for an electrical system, said method comprising the steps of:
identifying switches from a circuit schematic of the electrical system;
selecting an individual switch or a group of switches from a list displayed on a video terminal of a computer system;
organizing the identified switches within a top level switch group by nesting within each other a coincident group of switches to be closed together or a sequential group of switches to be closed one at a time;
defining a duration of time the switches in the sequential switch group or coincident switch group within the top level switch group should be closed;
organizing the top level switch group in a data tree structure for the switch sequence plan by nesting lower level sequential switch groups or coincident switch groups within higher level sequential switch groups or coincident switch groups;
traversing the data tree structure recursively to calculate opening and closing times for the switches within the sequential switch group or coincident switch group within the top level switch group for the switch sequence plan;
generating a simulation command for setting a position sequence of the switches within the sequential switch group or coincident switch group within the top level switch group from the opening and closing times for the switch sequence plan; and
using the switch commands within the sequence plan to operatively control the switches in a simulation of the electrical system.

12. A method as set forth in claim 11 including the step of determining a duration of time between switch closings for a sequential switch group.

13. A method as set forth in claim 11 including the step of using the switch sequence plan to analyze an electrical load distribution of the electrical system.

\* \* \* \* \*